(12) United States Patent
Zhu

(10) Patent No.: US 11,171,180 B2
(45) Date of Patent: Nov. 9, 2021

(54) ARRAY SUBSTRATE, DISPLAY DEVICE, AND DRIVING METHOD THEREOF

(71) Applicant: BOE Technology Group Co., Ltd., Beijing (CN)

(72) Inventor: Wenxiu Zhu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/642,214

(22) PCT Filed: Jan. 4, 2019

(86) PCT No.: PCT/CN2019/070475
§ 371 (c)(1),
(2) Date: Feb. 26, 2020

(87) PCT Pub. No.: WO2020/140284
PCT Pub. Date: Jul. 9, 2020

(65) Prior Publication Data
US 2021/0151517 A1    May 20, 2021

(51) Int. Cl.
*H01L 27/32* (2006.01)
*G09G 3/20* (2006.01)
*G09G 3/3208* (2016.01)
*H01L 51/52* (2006.01)

(52) U.S. Cl.
CPC ....... *H01L 27/3206* (2013.01); *G09G 3/2003* (2013.01); *G09G 3/3208* (2013.01); *H01L 27/3213* (2013.01); *H01L 51/5265* (2013.01); *G09G 2300/0439* (2013.01); *G09G 2320/0233* (2013.01); *G09G 2320/045* (2013.01); *G09G 2360/16* (2013.01)

(58) Field of Classification Search
CPC ............. H01L 27/3206; H01L 51/5265; H01L 27/3213; G09G 3/2003; G09G 3/3208; G09G 2300/0439; G09G 2320/0233; G09G 2320/045; G09G 2360/16
See application file for complete search history.

(56) References Cited

U.S. PATENT DOCUMENTS

2020/0212129 A1 * 7/2020 Jeong .................. H01L 27/3213

* cited by examiner

*Primary Examiner* — Abdul-Samad A Adediran
(74) *Attorney, Agent, or Firm* — Banner & Witcoff, Ltd.

(57) ABSTRACT

An array substrate, a display device, and a driving method thereof. The array substrate includes a base substrate including a display region and a locally transparent region located within the display region, the locally transparent region including at least one sub-region, and the sub-region including at least one transparent region; at least one first pixel, including a first reflective electrode, a first transflective electrode, and a first light emitting layer located between the first reflective electrode and the first transflective electrode, the first pixel being located in the display region; and at least one second pixel, comprising a second reflective electrode, a second transflective electrode, and a second light emitting layer located between the second reflective electrode and the second transflective electrode, the second pixel being located in an region other than the transparent region in the sub-region.

17 Claims, 4 Drawing Sheets

ARRAY SUBSTRATE, DISPLAY DEVICE, AND DRIVING METHOD THEREOF

The application is a U.S. National Phase Entry of International Application No. PCT/CN2019/070475 filed on Jan. 4, 2019, designating the United States of America. The present application claims priority to and the benefit of the above-identified application and the above-identified application is incorporated by reference herein in its entirety.

TECHNICAL FIELD

Embodiments of the present disclosure relate to an array substrate, a display device, and a driving method thereof.

BACKGROUND

At present, with the continuous development of the display device market, OLED (Organic Light Emitting Diode) display device has become one of the current mainstream display devices due to its advantages of self-luminescence, high contrast, thin thickness, wide viewing angle, fast response speed, flexibility and wide range of operating temperatures, etc.

An organic light emitting diode usually includes an anode, a cathode, and an organic electroluminescent unit sandwiched between the anode and the cathode. The organic electroluminescent unit includes at least a hole transport layer, a light emitting layer, and an electron transport layer. The organic electroluminescent unit of the organic light emitting diode is sandwiched between the anode and the cathode, and the optical thickness of the organic electroluminescent unit is almost of the same order of magnitude as the light emitting wavelength. In this way, the cathode and the anode of the organic light emitting diode can form a semiconductor microcavity capable of narrowing the spectrum, so that photons generated by the light emitting layer are limited in the semiconductor microcavity formed by the cathode and the anode and form strong multiple-beam interference, thereby narrowing the luminous spectrum and having a good modulation effect on the peak wavelength of the luminous spectrum.

SUMMARY

Embodiments of the present disclosure provide an array substrate, a display device, and a driving method thereof. The array substrate includes a base substrate, including a display region and a locally transparent region located within the display region, the locally transparent region including at least one sub-region, and the sub-region including at least one transparent region; at least one first pixel, including a first reflective electrode, a first transflective electrode, and a first light emitting layer located between the first reflective electrode and the first transflective electrode, the first pixel being located in the display region; and at least one second pixel, including a second reflective electrode, a second transflective electrode, and a second light emitting layer located between the second reflective electrode and the second transflective electrode, the second pixel being located in an region other than the transparent region in the sub-region, a reflectivity of the second transflective electrode is greater than a reflectivity of the first transflective electrode.

For example, in the array substrate provided by an embodiment of the present disclosure, a material of the first transflective electrode is the same as a material of the second transflective electrode, and a thickness of the second transflective electrode is greater than a thickness of the first transflective electrode.

For example, the array substrate provided by an embodiment of the present disclosure further includes a third pixel, including a first electrode, a second electrode, and a third light emitting layer located between the first electrode and the second electrode, the third pixel being located in the transparent region, the first electrode is a transparent electrode or a transflective electrode, and the second electrode is a transparent electrode or a transflective electrode.

For example, in the array substrate provided by an embodiment of the present disclosure, the first electrode includes indium tin oxide.

For example, in the array substrate provided by an embodiment of the present disclosure, a full width at half maximum of a luminous spectrum of the second pixel is smaller than a full width at half maximum of a luminous spectrum of the third pixel.

For example, in the array substrate provided by an embodiment of the present disclosure, a plurality of the first pixels surround the locally transparent region.

For example, in the array substrate provided by an embodiment of the present disclosure, an area of the second pixel is ⅔ to ¾ of an area of the first pixel.

For example, in the array substrate provided by an embodiment of the present disclosure, a full width at half maximum of a luminous spectrum of the second pixel is smaller than a full width at half maximum of a luminous spectrum of the first pixel.

For example, in the array substrate provided by an embodiment of the present disclosure, each of the sub-regions includes four pixel regions with equal areas arranged in a 2×2 matrix, and the second pixel and the third pixel are located in two of the four pixel regions on a diagonal of the 2×2 matrix.

At least one embodiment of the present disclosure further provides a display device, including: an image acquisition component; and the abovementioned array substrate, the array substrate includes a light emitting side, an orthographic projection of the image acquisition component on the base substrate falls into the locally transparent region and the image acquisition component is located on a side of the array substrate opposite to the light emitting side.

For example, in the display device provided by an embodiment of the present disclosure, the transparent region includes a third pixel including a first electrode, a second electrode, and a third light emitting layer located between the first electrode and the second electrode, the first electrode is a transparent electrode or a transflective electrode, and the second electrode is a transparent electrode or a transflective electrode.

For example, the display device provided by an embodiment of the present disclosure further includes a driver, connected to the first pixel, the second pixel and the third pixel, respectively, each of the sub-regions includes a plurality of pixel regions with equal areas, and the driver is configured to drive the second pixel and the third pixel to emit light together upon one or more of the pixel regions in the sub-region being required to emit light.

At least one embodiment of the present disclosure further provides a driving method of a display device, wherein the display device includes the abovementioned display device, each of the sub-regions includes a plurality of pixel regions having equal areas, the driving method includes: driving the first pixel, the second pixel and the third pixel respectively to emit light to display a picture together includes driving the second pixel and the third pixel to emit light together upon one or more of the pixel regions in the sub-region being required to emit light.

For example, the driving method of the display device further includes: performing a color matching process to the second pixel and the third pixel respectively by a color matching method, to drive the second pixel and the third pixel to emit light together to display the picture together with the first pixel, the color matching method includes: acquiring color coordinate matrices of the second pixel and the third pixel respectively; acquiring tristimulus values of the second pixel and the third pixel respectively according to a color and brightness to be displayed in the sub-region and a brightness distribution ratio of the second pixel and the third pixel; acquiring brightness of sub-pixels in the second pixel and the third pixel respectively according to the color coordinate matrices and the tristimulus values; and acquiring driving voltages of the sub-pixels in the second pixel and the third pixel respectively according to the brightness of the sub-pixels in the second pixel and the third pixel.

For example, in the driving method of the display device provided by an embodiment of the present disclosure, acquiring brightness of sub-pixels in the second pixel and the third pixel respectively according to the color coordinate matrices and the tristimulus values further includes: acquiring brightness of the respective sub-pixels in the second pixel and the third pixel respectively according to the color coordinate matrices and the tristimulus values by the following color matching formula:

$$\begin{bmatrix} L_R \\ L_G \\ L_B \end{bmatrix} = \begin{bmatrix} R_X & G_X & B_X \\ R_Y & G_Y & B_Y \\ R_Z & G_Z & B_Z \end{bmatrix}^{-1} \cdot \begin{bmatrix} X \\ Y \\ Z \end{bmatrix}$$

wherein $L_R$, $L_G$ and $L_B$ are brightness of red, green and blue sub-pixels in the second pixel or the third pixel respectively; X, Y and Z are the tristimulus values; Rx, Ry, Rz, Gx, Gy, Gz, Bx, By, and Bz are parameters calculated from the color coordinates of R (red), G (green), and B (blue); the matrix composed of Rx, Ry, Rz, Gx, Gy, Gz, Bx, By, and Bz is the color coordinate matrix of the second pixel or the third pixel.

For example, in the driving method of the display device provided by an embodiment of the present disclosure, acquiring color coordinate matrices of the second pixel and the third pixel respectively includes: lighting the second pixel and the third pixel respectively; and acquiring a color coordinate matrix of the second pixel according to the brightness and colors of sub-pixels in the second pixel, and acquiring a color coordinate matrix of the third pixel according to the brightness and colors of sub-pixels in the third pixel.

BRIEF DESCRIPTION OF THE DRAWINGS

In order to clearly illustrate the technical solution of embodiments of the present disclosure, the drawings of the embodiments will be briefly described in the following. It is obvious that the drawings in the description are only related to some embodiments of the present disclosure and not limited to the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. The terms "comprise," or "include," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1:
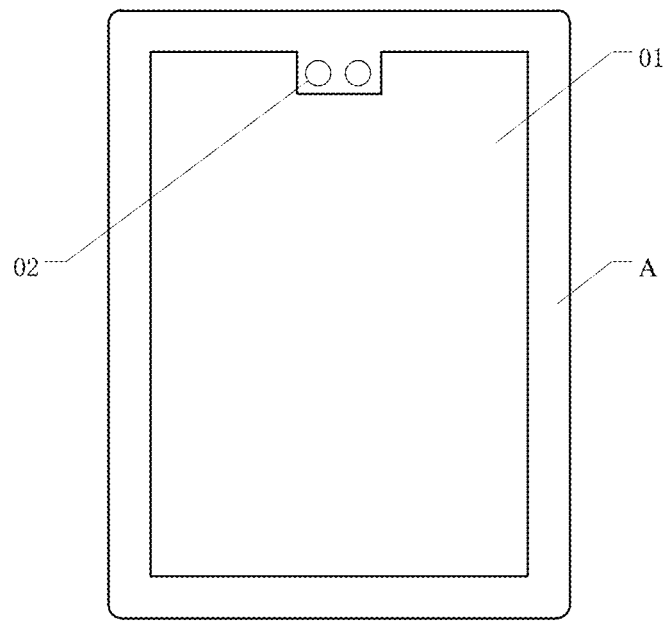
FIG. 1 is a schematic plan view of a display device.

At present, with the continuous development of the smart phone market, the "full screen" design, that is, the design with high screen ratio, is also increasingly recognized by the market, and thus has become a hot research topic for major manufacturers. Because the screen ratio of the display device gradually increases, it is impossible to further increase the screen ratio simply by reducing the border width. FIG. 1 is a schematic plan view of a display device. As illustrated by FIG. 1, a display screen 01 for providing a display function and a front camera 02 for providing a photographing function are provided on a surface A of the display device. For example, the display device can be a mobile phone, a tablet computer, etc. As illustrated by FIG. 1, in order to further increase the ratio of an area of the display screen 01 to an area of the surface A, that is, the screen ratio, the front camera 02 can be provided below the display screen 01.

Figure 2:
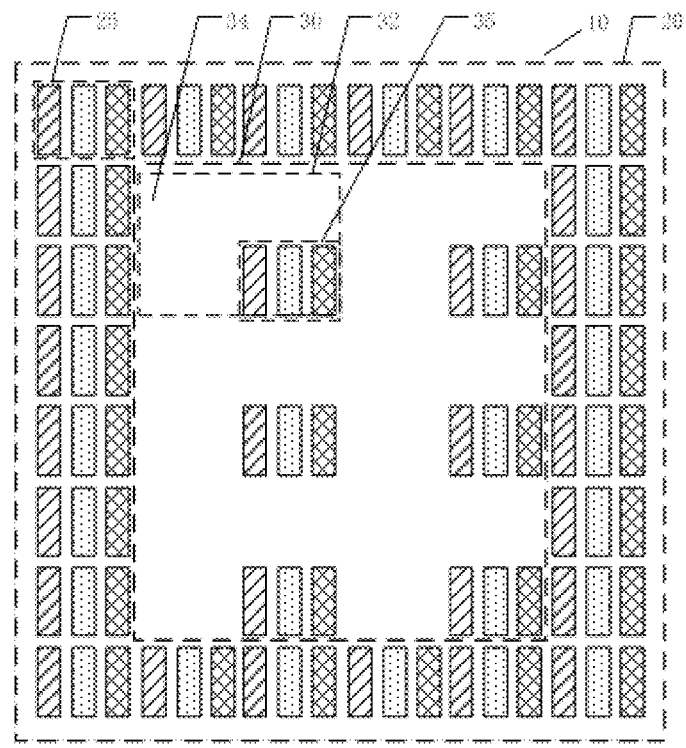
FIG. 2 is a schematic plan view of an array substrate.

However, in a case where the front camera is provided below the display screen, a region of the display screen corresponding to the front camera needs to have a certain transmittance to meet the photographing requirements of the front camera. FIG. 2 is a schematic plan view of an array substrate. As illustrated by FIG. 2, the array substrate includes a base substrate 10, a display region 20 located on the base substrate 10, and a locally transparent region 30 located on the base substrate 10. The locally transparent region 30 is located within the display region 20. The display region 20 includes a plurality of first pixels 25; the locally transparent region 30 includes a plurality of sub-regions 32. Each of the sub-regions 32 includes a borrowing pixel 35; a region other than the borrowing pixel 35 in each of the sub-regions 32 is a transparent region 34. Each of the sub-regions 32 includes a plurality of pixel regions with equal areas, for example, four pixel regions with equal areas, and one pixel region is occupied by the borrowing pixel 35. In this case, because the locally transparent region 30 of the array substrate includes the transparent region 34, the locally transparent region 30 can transmit light (the transmittance of the locally transparent region 30 can be adjusted by setting the number of pixel regions to meet the photographing requirement of the front camera). Therefore, in the display device using the array substrate, the front camera can be provided corresponding to the locally transparent region 30, for example, the front camera is provided below the locally transparent region 30, so that the front camera can acquire external light for photographing. In addition, in a case where the array substrate is used for display, the borrowing pixel 35 can emit light upon any pixel region in the sub-region 32 being required to emit light, so that the locally transparent region 30 of the array substrate can be used for display.

However, the inventor(s) of the present application has noticed that, in a case where the array substrate shown in FIG. 2 is used for display, upon a plurality of pixel regions in the sub-region being required to emit light, brightness of the borrowing pixel 35 is several times of brightness of the first pixel 25. In this case, the current density driving the borrowing pixel 35 is relatively large, resulting in a relatively short life-time of the borrowing pixel 35. Moreover, as the use time of the array substrate increases, the luminous brightness of the borrowing pixels 35 will be attenuated, resulting in poor display. On the other hand, because the number of the borrowing pixels in the sub-region is less, the resolution of the sub-region is reduced, which results in obvious difference between the display resolution of the locally transparent region and the display resolution of other regions in the display region.

In view of this, the embodiments of the present disclosure provide an array substrate, a display device, and a driving method thereof. The array substrate includes a base substrate, a display region located on the base substrate, and a locally transparent region located on the base substrate. The display region includes a plurality of first pixels; the locally transparent region is located in the display region and includes a plurality of sub-regions. Each of the sub-regions includes a transparent region and a second pixel. The first pixel includes a first reflective electrode, a first transflective electrode, and a first light emitting layer between the first reflective electrode and the first transflective electrode. The second pixel includes a second reflective electrode, a second transflective electrode, and a second light emitting layer between the second reflective electrode and the second transflective electrode. A reflectivity of the second transflective electrode is greater than a reflectivity of the first transflective electrode. Because the reflectivity of the second transflective electrode is greater than the reflectivity of the first transflective electrode, a microcavity effect of a microcavity structure formed by the second reflective electrode and the second transflective electrode in the second pixel is stronger, resulting in a narrower full width at half maximum of light emitted by the second pixel, so that the light emitting efficiency of the second pixel is higher. Compared with the first pixel, the luminous brightness of the second pixel driven by the same current density is greatly improved. Thus, upon one or more regions other than the second pixel in the sub-region being required to emit light, the second pixel can emit light instead of these regions. Because the luminous efficiency of the second pixel is greatly improved, the current density as required by the second pixel is relatively small, the life-time of the second pixel can be greatly prolonged, and the poor display caused by the increasement of the use time can be avoided.

Hereinafter, the array substrate, the display device, and the driving method thereof provided by the embodiments of the present disclosure will be described below with reference to the accompanying drawings.

Figure 3:
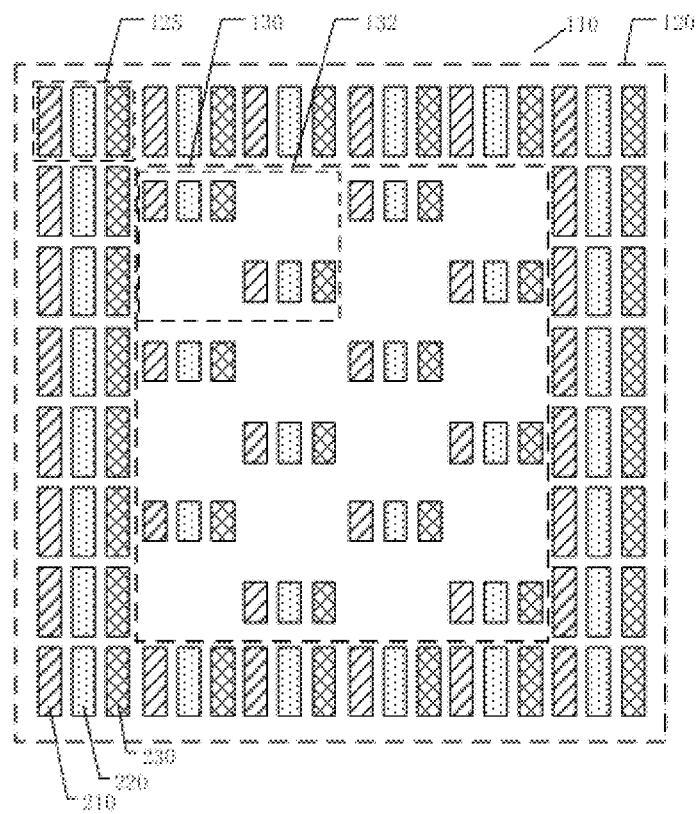
FIG. 3 is a schematic diagram of an array substrate according to an embodiment of the present disclosure.
Figure 4:
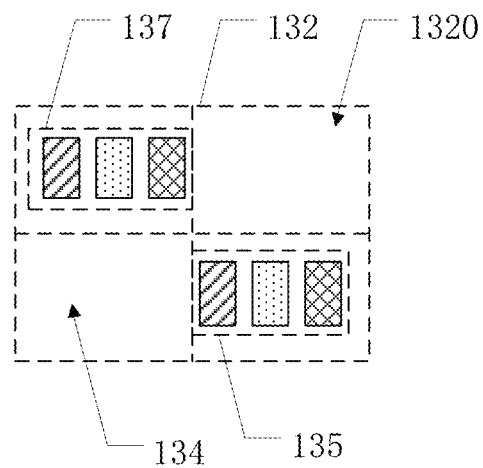
FIG. 4 is an enlarged schematic view of a sub-region in the array substrate shown in FIG. 3.
Figure 5:
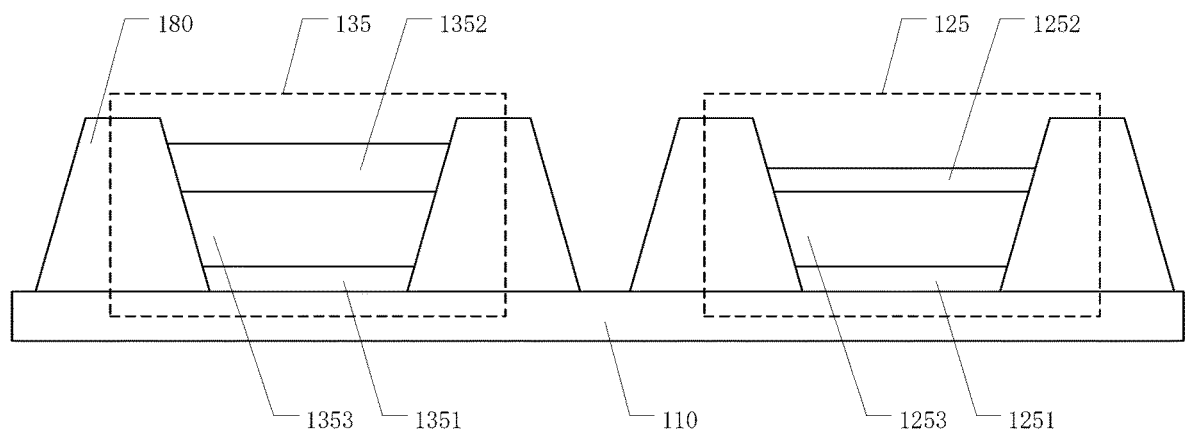
FIG. 5 is a schematic cross-sectional view of a first pixel and a second pixel in an array substrate according to an embodiment of the present disclosure.

FIG. 3 is a schematic diagram of an array substrate according to an embodiment of the present disclosure. FIG. 4 is an enlarged schematic view of a sub-region in the array substrate shown in FIG. 3. FIG. 5 is a schematic cross-sectional view of a first pixel and a second pixel in an array substrate according to an embodiment of the present disclosure. As illustrated by FIGS. 3 and 4, the array substrate includes a base substrate 110, a display region 120 located on the base substrate 110, and a locally transparent region 130 located within the display region 120, i.e., the base substrate 110 includes a display region 120 and a locally transparent region 130 located within the display region 120. The display region 120 includes a plurality of first pixels 125 for displaying a picture. The locally transparent region 130 includes a plurality of sub-regions 132, and each of the plurality of sub-regions 132 includes a transparent region 134 and a second pixel 135. That is, each of the sub-regions 132 includes at least one transparent region 134, and the second pixel 135 is located in a region of the sub-region 132 other than the transparent region 134. The locally transparent region 130 can display a picture together with the plurality of first pixels 125 in the display region 120. That is, the locally transparent region 130 is a part of the display region 120. As illustrated by FIG. 5, the first pixel 125 includes a first reflective electrode 1251, a first transflective electrode 1252, and a first light emitting layer 1253 between the first reflective electrode 1251 and the first transflective electrode 1252. The second pixel 135 includes a second reflective electrode 1351, a second transflective electrode 1352, and a second light emitting layer 1353 between the second reflective electrode 1351 and the second transflective electrode 1352. A reflectivity of the second transflective electrode 1352 is greater than a reflectivity of the first transflective electrode 1252.

In the array substrate provided by the embodiment, in the first pixel 125, the first reflective electrode 1251 and the first transflective electrode 1252 form a microcavity structure, so that light directly emitted by the first light emitting layer 1253 and light reflected by the first reflective electrode 1251 or the first transflective electrode 1252 can interfere with each other in the microcavity structure, thereby narrowing the luminous spectrum. In the second pixel 135, the second reflective electrode 1351 and the second transflective electrode 1352 can also form a micro-cavity structure, so that light directly emitted from the second light emitting layer 1253 and light reflected by the second reflective electrode 1351 or the second transflective electrode 1352 can interfere with each other in the micro-cavity structure, thereby narrowing the luminous spectrum. Because the reflectivity of the second transflective electrode 1352 is greater than the reflectivity of the first transflective electrode 1252, the microcavity effect of the microcavity structure formed by the second reflective electrode 1351 and the second transflective electrode 1352 in the second pixel 135 is stronger, resulting in a narrower full width at half maximum of the light emitted from the second pixel 135, so that the light emitting efficiency of the second pixel 135 is higher. Compared with the first pixel 125, the luminous brightness of the second pixel 135 driven by the same current density is greatly improved. Thus, upon one or more regions of the sub-region 132 other than the second pixel 135 being required to emit light, the second pixel 135 can emit light instead of these regions. Because the luminous efficiency of the second pixel 135 is greatly improved, the current density as required is relatively small, the life-time of the second pixel 135 can be greatly prolonged, and the poor display caused by the increasement of the use time can be avoided.

It should be noted that, in a normal OLED display device, in order to give consideration to factors such as visual angle, etc., the microcavity effect of the microcavity structure in the pixel is set low, and the luminous efficiency of the pixel is not the highest. Therefore, compared with the first pixel, the light emitting efficiency of the second pixel provided by the embodiment of the present disclosure has room for improvement, so that the light emitting efficiency of the second pixel can be larger than the light emitting efficiency of the first pixel by improving the reflectivity of the second transflective electrode in the second pixel.

In an embodiment of the present disclosure, as illustrated by FIGS. 3 and 4, the first pixel 125 and the second pixel 135 can respectively include a plurality of sub-pixels 200 for emitting light with different colors, for example, a red sub-pixel 210, a green sub-pixel 220, and a blue sub-pixel 230. In this case, the first reflective electrode 1251 of the first pixel 125 can be the reflective electrode(s) of all sub-pixels 200 included in the first pixel 125, the first transflective electrode 1252 of the first pixel 125 can be the transflective electrode(s) of all sub-pixels 200 included in the first pixel 125, and the first light emitting layer 1253 of the first pixel 125 can be the light emitting layer(s) of all sub-pixels 200 included in the first pixel 125. Similarly, the second reflective electrode 1351 of the second pixel 135 may be the reflective electrode(s) of all sub-pixels 200 included in the second pixel 135, the second transflective electrode 1352 of the second pixel 135 can be the transflective electrode(s) of all sub-pixels 200 included in the second pixel 135, and the second light emitting layer 1353 of the second pixel 135 can be the light emitting layer(s) of all sub-pixels 200 included in the second pixel 135.

In the disclosed embodiment, in a case where the first pixel and the second pixel can respectively include a plurality of sub-pixels for emitting light with different colors, for example, a red sub-pixel, a green sub-pixel and a blue sub-pixel, a distance between the reflective electrode and the transflective electrode in one of the plurality of sub-pixels can be determined according to the color of light emitted by the sub-pixel, that is, the distances between the reflective electrodes and the transflective electrodes of the plurality of sub-pixels included in the first pixel can be different.

For example, in the array substrate provided in an embodiment of the present disclosure, as illustrated by FIG. 5, the array substrate further includes a pixel defining layer 180 for defining the sub-pixels.

For example, in the array substrate provided by an embodiment of the present disclosure, as illustrated by FIGS. 3 and 4, the first pixels 125 surround the locally transparent region 130. The "surround" here includes a completely surrounding situation and a locally surrounding situation. For example, the first pixels 125 can be distributed in the entire peripheral region of the locally transparent region 130, or can be distributed in a portion of the peripheral region of the locally transparent region 130. For example, in a case where the locally transparent region 130 has a shape of a rectangle, the first pixels 125 can surround one, two, three, or four edges of the rectangle. For another example, the first pixels 125 surround at least ½ of the circumference of the locally transparent region 130.

For example, in some examples, the first transflective electrode 1252 and the second transflective electrode 1352 can be made of the same material, and in this case, a thickness of the second transflective electrode 1352 is greater than a thickness of the first transflective electrode 1252, so that the reflectivity of the second transflective electrode 1352 is greater than the reflectivity of the first transflective electrode 1252.

For example, in some examples, the first transflective electrode 1252 and the second transflective electrode 1352 can be made of magnesium and silver, the thickness of the first transflective electrode 1252 can be 10-15 nm, and the thickness of the second transflective electrode 1253 can be 15-20 nm.

For example, in the array substrate provided in an embodiment of the present disclosure, the first reflective electrode 1251 and the second reflective electrode 1351 respectively include a stacked layer of indium tin oxide and silver. The stacked layer of indium tin oxide and silver can include two indium tin oxide layers and one silver layer between the two indium tin oxide layers. For example, a thickness of either of the two indium tin oxide layers can be 10 nm and a thickness of the silver layer can be 100 nm.

For example, in some examples, the transparent region 134 may not include pixels for display. Corresponding to the transparent region, each layer arranged on the base substrate is a transparent layer, so that the transparent region of the array substrate is transparent. In this case, the transparent region 134 is not used for display.

Figure 6:
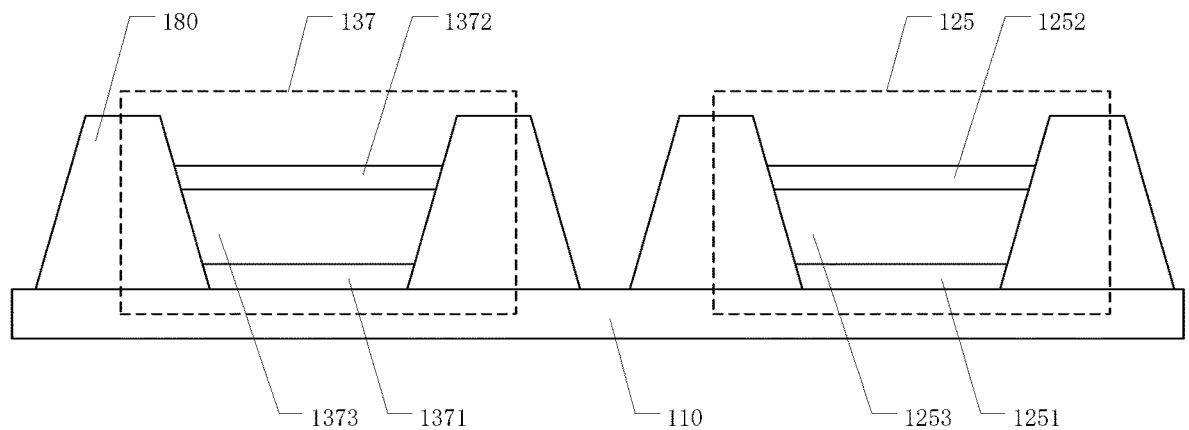
FIG. 6 is a schematic cross-sectional view of a first pixel and a third pixel in an array substrate according to an embodiment of the present disclosure.

For example, in some examples, as illustrated by FIGS. 3 and 4, in each of the sub-regions 132, the transparent region 134 further includes a third pixel 137. FIG. 6 is a schematic cross-sectional view of a first pixel and a third pixel in an array substrate according to an embodiment of the present disclosure. As illustrated by FIG. 6, the third pixel 137 includes a first electrode 1371, a second electrode 1372, and a third light emitting layer 1373 located between the first electrode 1371 and the second electrode 1372. The first electrode 1371 is a transparent electrode or a transflective electrode, and the second electrode 1372 is a transparent electrode or a transflective electrode. In a case where the first electrode 1371 and the second electrode 1372 are transparent electrodes, the corresponding transparent region is also transparent. In a case where the first electrode 1371 or the second electrode 1373 is a transflective electrode, the transparent region can also be regarded as a transparent region if the transmittance of the transflective electrode can satisfy the transmittance requirement of the transparent region (the specific transmittance is also set according to the actual situation).

Figure 7:
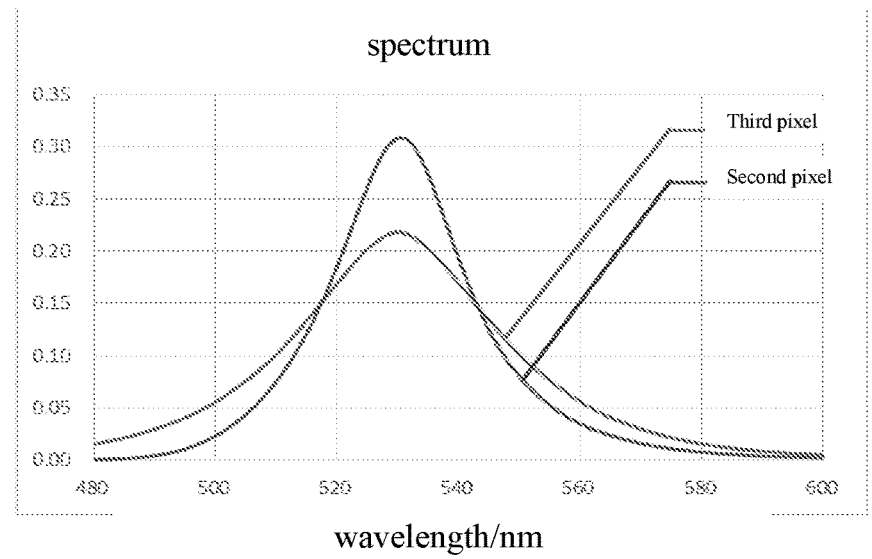
FIG. 7 is a schematic diagram of luminous spectrum of a second pixel and a third pixel according to an embodiment of the present disclosure.

FIG. 7 is a schematic diagram of a luminous spectrum of a second pixel and a third pixel according to an embodiment of the present disclosure. In the array substrate provided in this example, because the first electrode 1371 is a transparent electrode or a transflective electrode and the second electrode 1372 is a transparent electrode or a transflective electrode, as illustrated by FIG. 7, the microcavity effect of the microcavity structure formed by the first electrode 1371 and the second electrode 1372 in the third pixel 137 is relatively weak, the full width at half maximum of light emitted from the third pixel 137 is relatively wide. In order to improve the light emitting efficiency, the full width at half maximum of the second pixel 135 is relatively narrow, which is prone to generate a color shift phenomenon at a large viewing angle. Therefore, in a case where the second pixel 135 and the third pixel 137 display together, the third pixel 137 can effectively counteract the color shift phenomenon at a large viewing angle caused by the narrow full width at half maximum of the second pixel 135. For example, in a case where one or more regions of the sub-region 132 other than the second pixel 135 need to emit light, the second pixel 135 and the third pixel 137 can emit light together instead of these regions. In this case, the third pixel 137 can effectively counteract the color shift phenomenon at a large viewing angle caused by the narrow full width at half maximum of the second pixel 135.

On the other hand, because the first electrode 1371 is a transparent electrode or a transflective electrode, the second electrode 1372 is a transparent electrode or a transflective electrode, and the third pixel 137 itself is a semi-transparent pixel, the influence on the overall transmittance of the locally transparent region 130 is relatively small. In addition, the third pixel 137 can also increase PPI (Pixels Per Inch) in the locally transparent region 130, which can improve the resolution of the locally transparent region 130, thereby improving the display quality of the locally transparent region.

For example, in the array substrate provided by an embodiment of the present disclosure, the first electrode includes indium tin oxide.

For example, in the array substrate provided by an embodiment of the present disclosure, in order to further improve the transmittance of the locally transparent region 130, an area of the second pixel 135 can be smaller than an area of the first pixel 125, for example, the area of the second pixel 135 can be two-thirds to three-quarters of the area of the first pixel 125.

For example, in the array substrate provided by an embodiment of the present disclosure, the area of the third pixel 137 can be smaller than the area of the first pixel 125. Therefore, because the third pixel 137 is a semi-transparent pixel, the area of the second pixel 135 is smaller than the area of the first pixel 125, and the area of the third pixel 137 is also smaller than the area of the first pixel 125, although the array substrate provided in this example increases the PPI (Pixels Per Inch) in the locally transparent region, the transmittance of the locally transparent region can remain the same or even higher than the transmittance of the array substrate shown in FIG. 2.

For example, in the array substrate provided by an embodiment of the present disclosure, as illustrated by FIG. 4, each of the sub-regions 132 includes four pixel regions 1320 with equal areas arranged in a 2×2 matrix, and the second pixel 135 and the third pixel 137 are located in two pixel regions 1320 on a diagonal of the 2×2 matrix, thereby improving the uniformity of pixel distribution in the locally transparent region.

Figure 8:
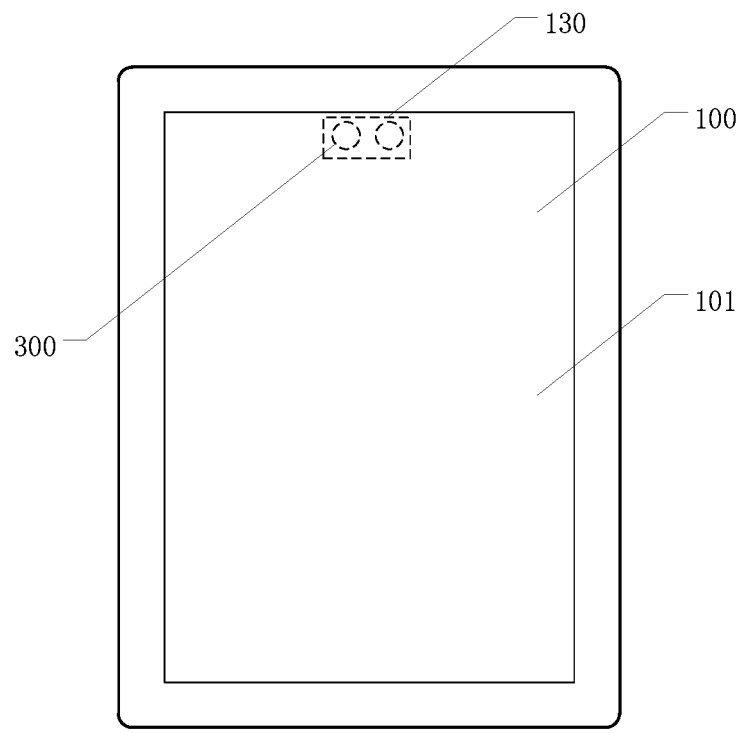
FIG. 8 is a schematic diagram of a display device according to an embodiment of the present disclosure.

FIG. 8 is a schematic diagram of a display device according to an embodiment of the present disclosure. As illustrated by FIG. 8, the display device includes an array substrate 100 and an image acquisition component 300, such as a camera or an infrared emitting component. The array substrate 100 can be any one of the array substrates provided by the above embodiments. For example, as illustrated by FIGS. 3 and 4, the array substrate 100 includes a base substrate 110, a display region 120 located on the substrate 110, and a locally transparent region 130 located within the display region 120. The display region 120 includes a plurality of first pixels 125 for displaying a picture. The locally transparent region 130 includes a plurality of sub-regions 132, each of the sub-regions 132 includes a transparent display region 134 and a second pixel 135. The locally transparent region 130 can display a picture together with the plurality of the first pixels 123 in the display region 120. That is, the locally transparent region 130 is a part of the display region 120. As illustrated by FIG. 5, the first pixel 125 includes a first reflective electrode 1251, a first transflective electrode 1252, and a first light emitting layer 1253 between the first reflective electrode 1251 and the first transflective electrode 1252. The second pixel 135 includes a second reflective electrode 1351, a second transflective electrode 1352, and a second light emitting layer 1353 between the second reflective electrode 1351 and the second transflective electrode 1352. A reflectivity of the second transflective electrode 1352 is greater than a reflectivity of the first transflective electrode 1252. In this case, an orthographic projection of an image acquisition component 300 on the base substrate 110 falls into the locally transparent region 130, the array substrate 100 includes a light emitting side 101 (an outward side of the paper as illustrated by FIG. 8), and the image acquisition component 300 is disposed on a side of the array substrate 100 opposite to the light emitting side 101.

In the display device provided in the embodiment, because the orthographic projection of the image acquisition component 300 on the base substrate 100 falls into the locally transparent region 130, a screen ratio of the display device can be further increased. In addition, because the reflectivity of the second transflective electrode 1352 is greater than the reflectivity of the first transflective electrode 1252, the microcavity effect of the microcavity structure formed by the second reflective electrode 1351 and the second transflective electrode 1352 in the second pixel 135 is stronger, resulting in a narrower full width at half maximum of the light emitted from the second pixel 135, so that the light emitting efficiency of the second pixel 135 is higher. Compared with the first pixel 125, the luminous brightness of the second pixel 135 driven by the same current density is greatly improved. Therefore, because the luminous efficiency of the second pixel 135 is greatly improved, the current density as required is smaller, the life-time of the second pixel 135 can be greatly prolonged, and poor display caused by the increase in use time can be avoided.

For example, in some examples, in each of the sub-regions 132, the transparent region 134 further includes a third pixel 137. The third pixel 137 includes a first electrode 1371, a second electrode 1372, and a third light emitting layer 1373 located between the first electrode 1371 and the second electrode 1372. The first electrode 1371 is a transparent electrode or a transflective electrode, and the second electrode 1372 is a transparent electrode or a transflective electrode. The microcavity effect of the microcavity structure formed by the first electrode 1371 and the second electrode 1372 in the third pixel 137 is relatively weak, and the full width at half maximum of the light emitted from the third pixel 137 is relatively wide, while the full width at half maximum of the second pixel 135 is narrower in order to improve the light emitting efficiency, which is easy to cause a color shift phenomenon at a large viewing angle. Therefore, in a case where the second pixel 135 and the third pixel 137 display together, the third pixel 137 can effectively counteract the color shift phenomenon at a large viewing angle caused by the narrow full width at half maximum of the second pixel 135. On the other hand, the third pixel 137 itself is a semi-transparent pixel and has a small influence on the overall transmittance of the locally transparent region 130. In addition, the third pixel 137 can also increase the PPI in the locally transparent region 130, which can improve the resolution of the locally transparent region 130, thereby improving the display quality of the locally transparent region. It should be noted that, although the first electrode of the third pixel is a transparent electrode or a transflective electrode, a part of the light may be directed to the image acquisition component, thus interfering with the image acquisition component. However, because this part of the light is less and the position of the third pixel and the light intensity of this part of the light are known, the interference caused by the third pixel can be eliminated through algorithm.

Figure 9:
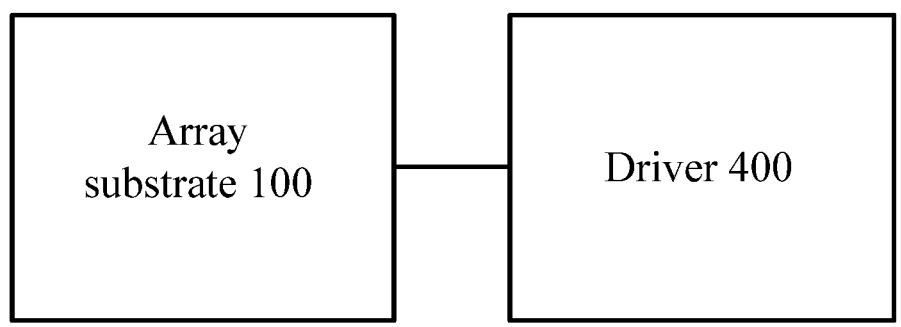
FIG. 9 is a schematic diagram of another display device according to an embodiment of the present disclosure.

FIG. 9 is a schematic diagram of another display device provided by an embodiment of the present disclosure. As illustrated by FIG. 9, in a case where the array substrate includes the third pixel, the display device further includes a driver 400 connected to the first pixel 125, the second pixel 135, and the third pixel 137, respectively, and the driver 400 is configured to respectively drive the first pixel 125, the second pixel 135, and the third pixel 137 to emit light to display a picture together. Each of the sub-region 132 includes a plurality of pixel regions 1320 having an equal area. The driver 300 is configured to drive the second pixel 135 and the third pixel 137 to emit light together to display the picture together with the first pixel 125 upon one or more pixel regions 1320 in the sub-region 132 being required to emit light, so that the normal display of the locally transparent region can be ensured, and the locally transparent region can have a certain transmittance to meet the photographing requirements of the image acquisition component.

For example, the driver can be a circuit or a controller (e.g., a programmable logic controller) that can implement the above-mentioned driving method, and can also include a processor that can execute a computer program and a storage device that stores a computer program that implements the above-mentioned driving method.

For example, in some examples, the first transflective electrode 1252 and the second transflective electrode 1352 can be made of the same material, and in this case, the thickness of the second transflective electrode 1352 is greater than the thickness of the first transflective electrode 1252, so that the reflectivity of the second transflective electrode 1352 is greater than the reflectivity of the first transflective electrode 1252.

An embodiment of the present disclosure provides a driving method of a display device. The display device can include the display device provided in the above embodiments. The driving method of the display device includes the following steps: driving the first pixel, the second pixel and the third pixel to emit light respectively, so as to display a picture together; and driving the second pixel and the third pixel to emit light together so as to display the picture together with the first pixel upon other regions except the second pixel and the third pixel in the sub-region being required to emit light.

For example, in some examples, the driving method of the display device further includes: performing a color matching process to the second pixel and the third pixel respectively by a color matching method, to drive the second pixel and the third pixel to emit light together to display the picture together with the first pixel, the color matching method comprises:

S301: acquiring color coordinate matrices of the second pixel and the third pixel respectively.

For example, the second pixel and the third pixel can be lit respectively, and then a color coordinate matrix of the second pixel can be obtained according to the brightness and colors of sub-pixels in the second pixel, and a color coordinate matrix of the third pixel can be obtained according to the brightness and colors of sub-pixels in the third pixel.

S302: acquiring tristimulus values of the second pixel and the third pixel respectively according to a color and brightness to be displayed in the sub-region and a brightness distribution ratio of the second pixel and the third pixel.

For example, a brightness distribution ratio of the second pixel and the third pixel can be determined according to luminous efficiencies and life-time of the second pixel and the third pixel. For example, upon the brightness to be displayed in the sub-region being 500 nit, the brightness distribution ratio of the second pixel and the third pixel can be 3:2, that is, the brightness of the second pixel can be 300 nit and the brightness of the third pixel can be 200 nit. Of course, embodiments of the present disclosure include but are not limited to this, and the brightness distribution ratio of the second pixel and the third pixel can also be other values.

S303: acquiring brightness of the sub-pixels in the second pixel and the third pixel respectively according to the color coordinate matrices and the tristimulus values by a color matching formula.

For example, the brightness of the respective sub-pixels in the second pixel can be obtained by a color matching formula according to the color coordinate matrix and tristimulus values of the second pixel, and the brightness of the respective sub-pixels in the third pixel can be obtained by a color matching formula according to the color coordinate matrix and the tristimulus values of the third pixel.

For example, the above color matching formula can be:

$$\begin{bmatrix} L_R \\ L_G \\ L_B \end{bmatrix} = \begin{bmatrix} R_X & G_X & B_X \\ R_Y & G_Y & B_Y \\ R_Z & G_Z & B_Z \end{bmatrix}^{-1} \cdot \begin{bmatrix} X \\ Y \\ Z \end{bmatrix}$$

wherein $L_R$, $L_G$ and $L_B$ are brightness of red, green and blue sub-pixels in the second pixel or the third pixel respectively; X, Y and Z are the tristimulus values; Rx, Ry, Rz, Gx, Gy, Gz, Bx, By, and Bz are parameters calculated from the color coordinates of R (red), G (green), and B (blue); the matrix composed of Rx, Ry, Rz, Gx, Gy, Gz, Bx, By, and Bz is the color coordinate matrix of the second pixel or the third pixel.

S304: acquiring driving voltages of the sub-pixels in the second pixel and the third pixel respectively according to the brightness of the respective sub-pixels in the second pixel and the third pixel.

For example, in some examples, the driving method of the display device further includes: transmitting brightness and driving voltages of the sub-pixels in the corresponding second pixel and third pixel to a driver to drive the first pixel, the second pixel and the third pixel to emit light to display a picture together.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto, variations or replacements within the technical scope disclosed by the present disclosure which can be easily envisaged by any skilled in the art shall fall in the protection scope of the present disclosure. Thus, the protection scope of the present disclosure should be based on the protection scope of the claims.

What is claimed is:

1. An array substrate, comprising:
   a base substrate, comprising a display region and a locally transparent region located in the display region, the locally transparent region comprising at least one sub-region, and the sub-region comprising at least one transparent region;
   at least one first pixel, comprising a first reflective electrode, a first transflective electrode, and a first light emitting layer located between the first reflective electrode and the first transflective electrode, the first pixel being located within the display region; and
   at least one second pixel, comprising a second reflective electrode, a second transflective electrode, and a second light emitting layer located between the second reflective electrode and the second transflective electrode, the second pixel being located in a region other than the transparent region in the sub-region,
   wherein a reflectivity of the second transflective electrode is greater than a reflectivity of the first transflective electrode.

2. The array substrate according to claim 1, wherein a material of the first transflective electrode is same as a material of the second transflective electrode, and a thickness of the second transflective electrode is greater than a thickness of the first transflective electrode.

3. The array substrate according to claim 1, further comprising:
   a third pixel, comprising a first electrode, a second electrode, and a third light emitting layer located between the first electrode and the second electrode, the third pixel being located in the transparent region,
   wherein the first electrode is a transparent electrode or a transflective electrode, and the second electrode is a transparent electrode or a transflective electrode.

4. The array substrate according to claim 3, wherein the first electrode comprises indium tin oxide.

5. The array substrate according to claim 3, wherein a full width at half maximum of a luminous spectrum of the second pixel is smaller than a full width at half maximum of a luminous spectrum of the third pixel.

6. The array substrate according to claim 1, wherein the at least one first pixel comprises a plurality of the first pixels, and the plurality of the first pixels surround the locally transparent region.

7. The array substrate according to claim 1, wherein an area of the second pixel is ⅔ to ¾ of an area of the first pixel.

8. The array substrate according to claim 1, wherein a full width at half maximum of a luminous spectrum of the second pixel is smaller than a full width at half maximum of a luminous spectrum of the first pixel.

9. The array substrate according to claim 3, wherein each of the at least one sub-region comprises four pixel regions with equal areas arranged in a 2×2 matrix, and the second pixel and the third pixel are located in two of the four pixel regions on a diagonal of the 2×2 matrix.

10. A display device, comprising:
    an image acquisition component; and
    the array substrate according to claim 1,
    wherein the array substrate comprises a light emitting side, an orthographic projection of the image acquisition component on the base substrate falls into the locally transparent region and the image acquisition component is located on a side of the array substrate opposite to the light emitting side.

11. The display device according to claim 10, wherein the transparent region comprises a third pixel comprising a first electrode, a second electrode, and a third light emitting layer located between the first electrode and the second electrode,
    wherein the first electrode is a transparent electrode or a transflective electrode, and the second electrode is a transparent electrode or a transflective electrode.

12. The display device according to claim 11, further comprising:
    a driver, connected to the first pixel, the second pixel, and the third pixel,
    wherein each of the at least one sub-region comprises a plurality of pixel regions with equal areas, and the driver is configured to drive the second pixel and the third pixel to emit light together upon one or more of the pixel regions in the sub-region being required to emit light.

13. The array substrate according to claim 5, wherein a full width at half maximum of a luminous spectrum of the second pixel is smaller than a full width at half maximum of a luminous spectrum of the first pixel.

14. A display device, comprising:
    a base substrate, comprising a display region and a locally transparent region located in the display region, the locally transparent region comprising at least one sub-region, and the sub-region comprising at least one transparent region, each of the at least one sub-region comprises a plurality of pixel regions having equal areas,
    at least one first pixel, comprising a first reflective electrode, a first transflective electrode, and a first light emitting layer located between the first reflective electrode and the first transflective electrode, the first pixel being located within the display region; and
    at least one second pixel, comprising a second reflective electrode, a second transflective electrode, and a second light emitting layer located between the second reflective electrode and the second transflective electrode, the second pixel being located in a region other than the transparent region in the sub-region, wherein a reflectivity of the second transflective electrode is greater than a reflectivity of the first transflective electrode,
    a third pixel, comprising a first electrode, a second electrode, and a third light emitting layer located between the first electrode and the second electrode, the third pixel being located in the transparent region, wherein the first electrode is a transparent electrode or a transflective electrode, and the second electrode is a transparent electrode or a transflective electrode, and
    a driver, connected to the first pixel, the second pixel, and the third pixel, and configured to drive the first pixel, the second pixel and the third pixel to emit light to display a picture together by driving the second pixel and the third pixel to emit light together upon one or more of the pixel regions in the sub-region being required to emit light.

15. The display device according to claim 14, wherein the driver is further configured to:

perform a color matching process to the second pixel and the third pixel via a color matching method, to drive the second pixel and the third pixel to emit light together to display the picture together with the first pixel, wherein the color matching method comprises:

acquiring color coordinate matrices of the second pixel and the third pixel;

acquiring tristimulus values of the second pixel and the third pixel according to a color and brightness to be displayed in the sub-region and a brightness distribution ratio of the second pixel and the third pixel;

acquiring brightnesses of sub-pixels in the second pixel and the third pixel according to the color coordinate matrices and the tristimulus values; and acquiring driving voltages of the sub-pixels in the second pixel and the third pixel according to the brightnesses of the sub-pixels in the second pixel and the third pixel.

16. The display device according to claim 15, wherein the acquiring the brightness of the sub-pixels in the second pixel and the third pixel according to the color coordinate matrices and the tristimulus values further comprises:

acquiring the brightnesses of the sub-pixels in the second pixel and the third pixel according to the color coordinate matrices and the tristimulus values by the following color matching formula:

$$\begin{bmatrix} L_R \\ L_G \\ L_B \end{bmatrix} = \begin{bmatrix} R_X & G_X & B_X \\ R_Y & G_Y & B_Y \\ R_Z & G_Z & B_Z \end{bmatrix}^{-1} \cdot \begin{bmatrix} X \\ Y \\ Z \end{bmatrix}$$

wherein $L_R$, $L_G$ and $L_B$ are brightnesses of red, green, and blue sub-pixels in the second pixel or the third pixel; X, Y and Z are the tristimulus values; Rx, Ry, Rz, Gx, Gy, Gz, Bx, By, and Bz are parameters calculated from the color coordinates of R (red), G (green), and B (blue); a matrix composed of Rx, Ry, Rz, Gx, Gy, Gz, Bx, By, and Bz is the color coordinate matrix of the second pixel or the third pixel.

17. The display device according to claim 15, wherein the acquiring the color coordinate matrices of the second pixel and the third pixel comprises:

lighting the second pixel and the third pixel respectively; and acquiring a color coordinate matrix of the second pixel according to the brightness and colors of sub-pixels in the second pixel, and acquiring a color coordinate matrix of the third pixel according to the brightness and colors of sub-pixels in the third pixel.

* * * * *